US 6,741,148 B2

(12) United States Patent
Killen et al.

(10) Patent No.: US 6,741,148 B2
(45) Date of Patent: May 25, 2004

(54) HIGH EFFICIENCY COUPLED LINE FILTERS

(75) Inventors: William D. Killen, Melbourne, FL (US); Randy T. Pike, Grant, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/185,459

(22) Filed: Jun. 27, 2002

(65) Prior Publication Data

US 2004/0000970 A1 Jan. 1, 2004

(51) Int. Cl.$^7$ ................................................. H01P 1/20
(52) U.S. Cl. ..................................... 333/203; 333/246
(58) Field of Search ............................... 333/203, 202, 333/249, 246

(56) References Cited

U.S. PATENT DOCUMENTS

| | | | |
|---|---|---|---|
| 3,571,722 A | 3/1971 | Vendelin |
| 3,678,418 A | 7/1972 | Woodward |
| 4,495,505 A | 1/1985 | Shields |
| 4,525,720 A | 6/1985 | Corzine et al. |
| 4,638,271 A | 1/1987 | Jecko et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Littlefield |
| 4,924,236 A | 5/1990 | Schuss et al. |
| 5,039,891 A | 8/1991 | Wen et al. |
| 5,148,130 A | 9/1992 | Dietrich |

(List continued on next page.)

FOREIGN PATENT DOCUMENTS

| | | |
|---|---|---|
| EP | 1 089 374 | 4/2001 |
| JP | 56 123102 | 9/1981 |
| JP | 07 015218 | 1/1995 |

OTHER PUBLICATIONS

U.S. patent application Ser. No. 10/448 973, Delgado et al., filed May 30, 2003.
U.S. patent application Ser. No. 10/184,277, Killen et al., filed Jun. 27, 2002.
U.S. patent application Ser. No. 10/185,443, Killen et al., filed Jun. 27, 2002.
U.S. patent application Ser. No. 10/184,332, Killen et al., filed Jun. 27, 2002.
U.S. patent application Ser. No. 10/185,251, Parsche et al., filed Jun. 27, 2002.
U.S. patent application Ser. No. 10/185,847, Killen et al., filed Jun. 27, 2002.
U.S. patent application Ser. No. 10/185,275, Killen et al., filed Jun. 27, 2002.
U.S. patent application Ser. No. 10/185,273, Killen et al., filed Jun. 27, 2002.
U.S. patent application Ser. No. 10/308,500, Killen et al., filed Dec. 3, 2002.
U.S. patent application Ser. No. 10/373,935, Killen et al., filed Feb. 25, 2003.
U.S. patent application Ser. No. 10/404,285, Killen et al., filed Mar. 31, 2003.

(List continued on next page.)

*Primary Examiner*—Don Le
(74) *Attorney, Agent, or Firm*—Sacco & Associates, PA

(57) ABSTRACT

A printed circuit for processing radio frequency signals includes a substrate including substrate regions upon which the printed circuit can be placed. The circuit is a coupled line filter including a plurality of resonator elements. The plurality of resonator line elements are at least partially coupled to respective substrate regions that have substrate characteristics that are each independently customizable. The circuit further comprises at least one ground or ground plane (50) coupled to the substrate.

20 Claims, 3 Drawing Sheets

U.S. PATENT DOCUMENTS

| | | |
|---|---|---|
| 5,379,006 A | 1/1995 | McCorkle |
| 5,455,545 A | 10/1995 | Garcia |
| 5,523,728 A | 6/1996 | McCorkle |
| 5,678,219 A | 10/1997 | Agarwal et al. |
| 6,052,039 A | 4/2000 | Chiou et al. |
| 6,114,940 A | 9/2000 | Kakinuma et al. |
| 6,133,806 A | 10/2000 | Sheen |
| 6,137,376 A | 10/2000 | Imbornone et al. |
| 6,184,845 B1 | 2/2001 | Leisten et al. |
| 6,307,509 B1 | 10/2001 | Krantz |

OTHER PUBLICATIONS

U.S. patent application Ser. No. 10/404,981, Killen et al., filed Mar. 31, 2003.

U.S. patent application Ser. No. 10/404,960, Killen et al., filed Mar. 31, 2003.

U.S. patent application Ser. No. 10/185,144, Killen et al., filed Jun. 27, 2002.

U.S. patent application Ser. No. 10/185,266, Killen et al., filed Jun. 27, 2002.

U.S. patent application Ser. No. 10/185,162, Rumpf, Jr. et al., filed Jun. 27, 2002.

U.S. patent application Ser. No. 10/185,824, Killen et al., filed Jun. 27, 2002.

U.S. patent application Ser. No. 10/185,187, Killen et al., filed Jun. 27, 2002.

U.S. patent application Ser. No. 10/185,855, Killen et al., filed Jun. 27, 2002.

U.S. patent application Ser. No. 10/185,480, Killen et al., filed Jun. 27, 2002.

U.S. patent application Ser. No. 10/439,094, Delgado et al., filed May 15, 2003.

HIGH EFFICIENCY COUPLED LINE FILTERS

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved performance in filters having two ports and coupled resonant lines.

2. Description of the Related Art

RF circuits, transmission lines, and antenna elements are commonly manufactured on specially designed substrate boards. For the purposes of these types of circuits, it is important to maintain careful control over impedance characteristics. If the impedance of different parts of the circuit do not match, this can result in inefficient power transfer, unnecessary heating of components, and other problems. Electrical length of transmission lines and radiators in these circuits can also be a critical design factor.

Two critical factors affecting the performance of a substrate material are permittivity (sometimes called the relative permittivity or $\epsilon_r$) and the loss tangent (sometimes referred to as the dissipation factor). The relative permittivity determines the speed of the signal, and therefore the electrical length of transmission lines and other components implemented on the substrate. The loss tangent characterizes the amount of loss that occurs for signals traversing the substrate material. Accordingly, low loss materials become even more important with increasing frequency, particularly when designing receiver front ends and low noise amplifier circuits.

Printed transmission lines, passive circuits and radiating elements used in RF circuits are typically formed in one of three ways. One configuration known as microstrip, places the signal line on a board surface and provides a second conductive layer, commonly referred to as a ground plane. A second type of configuration known as buried microstrip is similar except that the signal line is covered with a dielectric substrate material. In a third configuration known as stripline, the signal line is sandwiched between two electrically conductive (ground) planes. Ignoring loss, the characteristic impedance of a transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the physical geometry and spacing of the line structure as well as the permittivity of the dielectric material(s) used to separate the transmission line structures. Conventional substrate materials typically have a relative permeability of approximately 1.0.

In conventional RF design, a substrate material is selected that has a relative permittivity value suitable for the design. Once the substrate material is selected, the line characteristic impedance value is exclusively adjusted by controlling the line geometry and physical structure.

Radio frequency (RF) circuits are typically embodied in hybrid circuits in which a plurality of active and passive circuit components are mounted and connected together on a surface of an electrically insulating board substrate such as a ceramic substrate. The various components are generally interconnected by printed metallic conductors of copper, gold, or tantalum, for example that are transmission lines as stripline or microstrip or twin-line structures.

The permittivity of the chosen substrate material for a transmission line, passive RF device, or radiating element determines the physical wavelength of RF energy at a given frequency for that line structure. One problem encountered when designing microelectronic RF circuitry is the selection of a dielectric board substrate material that is optimized for all of the various passive components, radiating elements and transmission line circuits to be formed on the board. In particular, the geometry of certain circuit elements may be physically large or miniaturized due to the unique electrical or impedance characteristics required for such elements. For example, many circuit elements or tuned circuits may need to be an electrical ¼ wave. Similarly, the line widths required for exceptionally high or low characteristic impedance values can, in many instances, be too narrow or too wide respectively for practical implementation for a given substrate. Since the physical size of the microstrip or stripline is inversely related to the relative permittivity of the dielectric material, the dimensions of a transmission line can be affected greatly by the choice of substrate board material.

Still, an optimal board substrate material design choice for some components may be inconsistent with the optimal board substrate material for other components, such as antenna elements or filters. Moreover, some design objectives for a circuit component may be inconsistent with one another. For example, it may be desirable to reduce the size of an antenna element. This could be accomplished by selecting a board material with a relatively high dielectric. However, the use of a dielectric with a higher relative permittivity will generally have the undesired effect of reducing the radiation efficiency of the antenna. Accordingly, the constraints of a circuit board substrate having selected relative dielectric properties often results in design compromises that can negatively affect the electrical performance and/or physical characteristics of the overall circuit.

An inherent problem with the foregoing approach is that, at least with respect to the substrate material, the only control variable for line impedance is the relative permittivity, $\epsilon_r$. This limitation highlights an important problem with conventional substrate materials, i.e. they fail to take advantage of the other factor that determines characteristic impedance, namely $L_l$, the inductance per unit length of the transmission line.

Yet another problem that is encountered in RF circuit design is the optimization of circuit components for operation on different RF frequency bands. Line impedances and lengths that are optimized for a first RF frequency band may provide inferior performance when used for other bands, either due to impedance variations and/or variations in electrical length. Such limitations can limit the effective operational frequency range for a given RF system.

Conventional circuit board substrates are generally formed by processes such as casting or spray coating which generally result in uniform substrate physical properties, including the permittivity. Accordingly, conventional dielectric substrate arrangements for RF circuits have proven to be a limitation in designing circuits that are optimal in regards to both electrical and physical size characteristics.

SUMMARY OF THE INVENTION

In a first embodiment according to the invention, a circuit for processing radio frequency signals comprises a substrate where the circuit can be placed. The substrate includes at least one dielectric layer having a first set of substrate properties over a first region and at least a second set of substrate properties over a second region. The second set of substrate properties can be different than the first set of substrate properties. The circuit further comprises at least one ground plane coupled to said substrate and a coupled line filter, at least a portion of the coupled line filter is coupled to the second region.

In a second embodiment according to the invention, a printed circuit for processing radio frequency signals comprises a substrate upon which the circuit can be placed. The substrate includes at least one dielectric layer having a first set of dielectric properties over a first region and at least a second set of dielectric properties over a second region. The second set of dielectric properties provide a different dielectric permittivity or magnetic permeability or both as compared to the first set of dielectric properties. The printed circuit further comprises at least one ground disposed in or on said substrate and a coupled line filter. The coupled line filter includes a plurality of resonator elements coupled to at least a portion of the second region.

In a third embodiment of the present invention, a printed circuit for processing radio frequency signals comprises a substrate including substrate regions upon which the circuit can be placed. The circuit is a coupled line filter including a plurality of resonator line elements and at least one ground coupled to said substrate. The plurality of resonator line elements are at least partially coupled to respective substrate regions that have substrate characteristics that are each independently customizable.

DETAILED DESCRIPTION OF THE PREFERRED EMBODIMENTS

Figure 1:
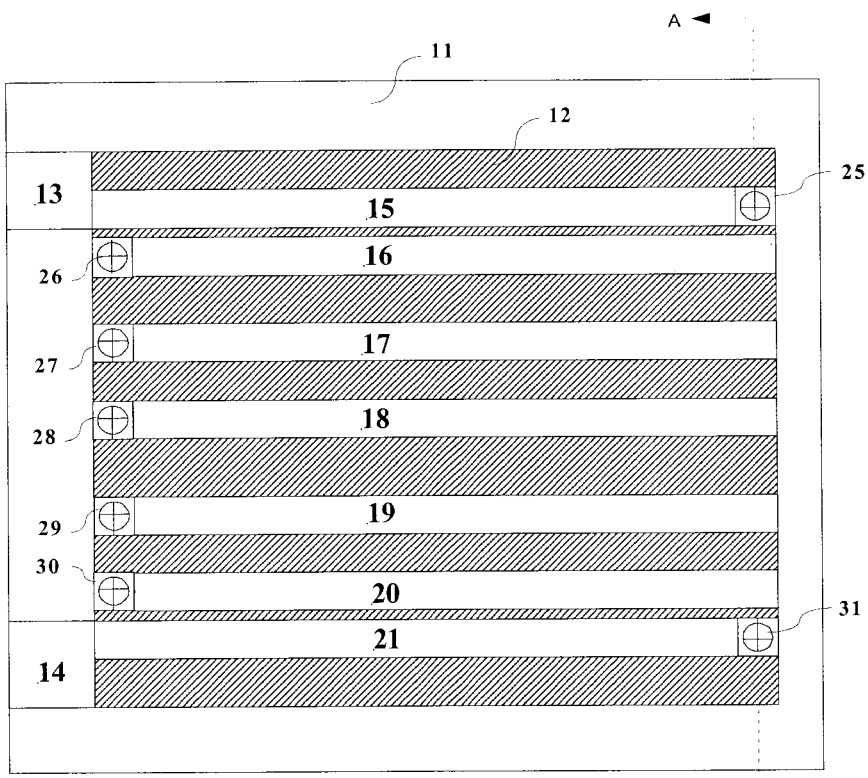
FIG. 1 is a top view of a coupled line filter formed on a substrate for reducing the size of the coupled line filter in accordance with the present invention.
Figure 2:
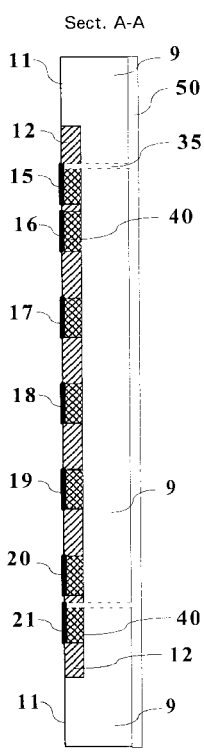
FIG. 2 is a cross-sectional view of the coupled line filter of FIG. 1 taken along line A—A.

Referring to FIG. 1, coupled line filter 10 serving as a combline bandpass filter is mounted on layer of substrate material or dielectric material (dielectric layer) 11. In FIG. 1, the coupled line filter 10 is configured as having an input port 13 and an output port 14 and a plurality (1 through n) of mutually coupled resonator elements 15, 16, 17, 18, 19, 20, and 21. Although seven resonators are shown, it should be understood that more or less resonator elements could be used in accordance with the present invention. The combline bandpass filter preferably consists of mutually coupled resonators that can be physically less than a quarter wavelength long and can be grounded at one end (as shown by ground points 25, 26, 27, 28, 29, 30, and 31) and capacitively loaded at an opposing end of the resonator element. The ground points are typically grounded to a ground plane 50 through metalized vias 35 as shown in the cross-sectional view of FIG. 2. The present invention utilizes substrate materials of differing substrate characteristics coupled to the resonator elements. In particular, substrate materials (12 and 40) having different dielectric properties and magnetic properties are coupled beneath and between each resonator in the plurality of resonators 15–21. FIG. 2 depicts a cross-sectional view of the coupled line filter 10 along line A—A, where magnetic materials 40 are placed underneath the resonators (15–21) to shorten and widen the lines of the filter. Magnetic materials between the lines and ground provide an addition means to control the width of the line. FIG. 2 further illustrates that where high coupling is desired (close spacing), the coupling can be improved (i.e., the even and odd mode impedances better matched).

The internal line spacings between resonators can be sufficiently large to avoid any tolerance problems, even for moderately wide bandwidths. Bandwidth is a design constraint and traded against fabrication constraints. Resonator length is also a design choice, except that it must be less than 90 degrees, as at 90 degrees length, the magnetic and electrostatic coupling totally cancel. At less than 90 degrees, magnetic coupling predominates. Resonator line lengths from 45 degrees to less than 30 degrees result in compact structures with excellent stop band performance. The minimum practical line length is limited by decreased unloaded Q and a requirement for heavy capacitive loading. The requirement for lumped capacitors for loading also represents a realization nuisance.

Figure 3:
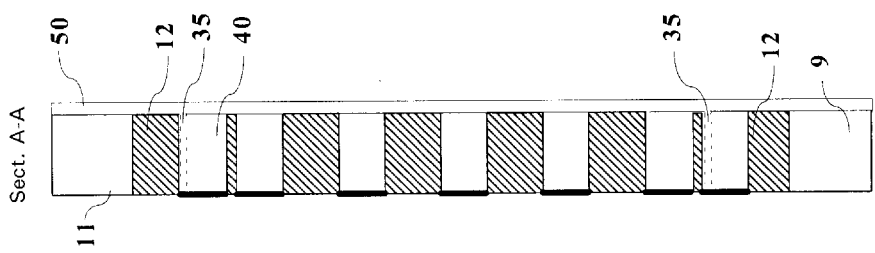
FIG. 3 is a cross-sectional view of an alternate embodiment of the coupled line filter of FIG. 1 taken along line A—A.

FIG. 3 is a cross-sectional view of FIG. 1 along line A—A illustrating an alternative embodiment where the differing substrate materials 12 and 40 are coupled between the top plane of the substrate 11 and the ground plane 50. In particular, substrate material 40 couples between the resonator lines or traces and the ground plane 50. It will be appreciated by those skilled in the art, however, that the invention is not so limited and the coupled lines also can be configured in differing shapes based on the desired function and the properties of substrate materials coupled thereto.

The elements 15 through 21 are resonant lines. A resonant line is a transmission line typically used in radio frequency (RF) circuits. A resonant line has finite length and is not terminated in its characteristic impedance ($Z_0$). The mismatch between $Z_0$ and the impedance at the termination (load impedance, $Z_L$) causes energy reflections to occur. These energy reflections can increase or decrease a voltage on the line, depending on the frequency of the applied voltage and the position on the line where the voltage is being measured. Accordingly, at some frequencies a resonant line of a given length may have high input impedance, similar to a parallel resonant circuit at resonance, while at other frequencies the resonant line may have low input impedance, similar to a series resonant circuit at resonance. At other frequencies the resonant line may also have complex or reactive impedances.

On printed circuit boards or substrates, single port resonant lines are typically implemented by creating a line with a single port at the input and either open-circuited or short-circuited to ground at the termination. The electrical length of a single port resonant line is usually some multiple of a quarter-wavelength of a selected frequency. On a short-circuited line, each point at an odd number of quarter-wavelengths from the termination has high impedance and relative voltage maxima, and each point at an even number of quarter-wavelengths from the termination has a low impedance and a relative voltage minima. The positions of voltage maxima and minima are reversed on an open-circuited resonant line. The input impedance to a single port resonant line is typically resistive when the length of the resonant line is an even or odd multiple of the quarter-wavelength of the operational frequency. That is, the input to the single port resonant line is at a position of voltage maxima or minima.

When the input to the single port resonant line is at a position between the voltage maxima and minima points, the input impedance can have reactive components, which can be a useful feature. For example, resonant lines may also act as nearly pure capacitances or inductances. For example, an open-circuited line acts as a pure capacitance at ⅛ wavelength long, acts as a series LC impedance at ¼ wavelength long, acts a pure inductance at ⅜ wavelengths long, and acts like a parallel LC circuit at ½ wavelength long. This cycle repeats every half wavelength with smooth transitions between each of the above mentioned points. Thus, properly chosen single port resonant line segments may be used as parallel-resonant, series-resonant, inductive, or capacitive circuits.

A short-circuited line acts as a pure inductance at ⅛ wavelength long, acts as a parallel LC impedance at ¼ wavelength long, acts a pure capacitance at ⅜ wavelengths long, and acts like a series LC circuit at ½ wavelength long. This cycle repeats every half wavelength with smooth transitions between each of the above mentioned points. Thus, properly chosen single port resonant line segments may be used as parallel-resonant, series-resonant, inductive, or capacitive circuits.

When a resonant line is terminated in capacitance, the capacitor does not absorb energy, but returns all of the energy to the circuit. The impedance discontinuity between the line impedance and the termination produce a reflected wave that adds to the incidicent wave to produce a standing wave. The voltage of the standing wave is a minimum at a distance of exactly ⅛ wavelength from the end if the termination when the termination capacitive reactance has the same absolute value as $Z_0$. If the capacitive reactance is greater than $Z_0$ (smaller capacitance), the termination looks more like an open circuit and the voltage minimum moves away from the end. If the capacitive reactance is smaller than $Z_0$, the voltage minimum moves closer to the end.

Single port resonant lines are commonly manufactured on specially designed printed circuit boards. The resonant lines can be formed many different ways. Three common configurations are described next. One configuration known as microstrip places the resonant line on a board surface and provides a second conductive layer coupled to the board. This second conductive layer is commonly referred to as a ground plane. A second type of configuration known as buried microstrip is similar except that the resonant line is covered with a dielectric substrate material. In a third configuration known as stripline, the resonant line is sandwiched between two electrically conductive (ground) planes, which can be proximate to the board or coupled to the board. As defined herein, coupled to the board means attached to the surface of the board or contained within the board.

Low dielectric constant printed circuit board materials are ordinarily selected for RF circuit designs. For example, polytetrafluoroethylene (PTFE) based composites such as RT/duroid® 6002 (dielectric constant of 2.94; loss tangent of 0.009) and RT/duroid® 5880 (dielectric constant of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide dielectric layers having relatively low dielectric constants with accompanying low loss tangents.

However, use of conventional board materials can compromise the miniaturization of circuit elements and may also compromise some performance aspects of circuits that can benefit from high dielectric constant layers. A typical tradeoff in a communications circuit is between the physical size of antenna elements versus efficiency. By comparison, the present invention provides the circuit designer with an added level of flexibility by permitting use of locally high dielectric constant dielectric layer portions and locally low dielectric constant layer portions. In addition, localized board portions can be optimized for efficiency through the ability to select localized magnetic board properties. This added flexibility enables improved performance and line element density not otherwise possible.

Dielectric substrate boards having metamaterial portions providing localized and selectable magnetic and dielectric properties can be prepared in the following manner. As defined herein, the term "metamaterials" refers to composite materials formed from the mixing or arrangement of two or more different materials at a very fine level, such as the Angstrom or nanometer level. Metamaterials allow tailoring of electromagnetic properties of the composite, which can be defined by effective electromagnetic parameters comprising effective electrical permittivity $\in_{\mathit{eff}}$ (or dielectric constant) and the effective magnetic permeability, $\mu_{\mathit{eff}}$.

Appropriate bulk dielectric ceramic substrate materials can be obtained from commercial materials manufacturers, such as DuPont and Ferro. The unprocessed material, commonly called Green Tape™, can be cut into sized portions from a bulk dielectric tape, such as into 6 inch by 6 inch portions. For example, DuPont Microcircuit Materials provides Green Tape material systems, such as 951 Low-Temperature Cofire Dielectric Tape and Ferro Electronic Materials ULF28-30 Ultra Low Fire COG dielectric formulation. These substrate materials can be used to provide dielectric layers having relatively moderate dielectric constants with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying portions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include metamaterials. The choice of a metamaterial composition can provide controllable effective dielectric constants over a relatively continuous range from less than 2 to at least 2650. Controllable magnetic properties are also available from certain metamaterials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a dielectric substrate layer that result in at least one of the dielectric and magnetic properties being different at one portion of the substrate as compared to another portion. A differentially modified board substrate preferably includes one or more metamaterial containing regions.

For example, the modification can be selective modification where certain dielectric layer portions are modified to produce a first set of dielectric or magnetic properties, while other dielectric layer portions are modified differentially or left unmodified to provide dielectric and/or magnetic properties different from the first set of properties. Differential modification can be accomplished in a variety of different ways.

According to one embodiment, a supplemental dielectric layer can be added to the dielectric layer. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing dielectric layer. For example, a supplemental dielectric layer can be used for providing a substrate portion having an increased effective dielectric constant.

Responses of a dielectric layer to a given energetic stimuli may be substantially permanent in whole or in part. Permanent responses permit one time application of an appropriate stimulus to achieve one or more desired physical dielectric layer properties. Physical properties may also be dynamically controlled, such as through the use of discharge electrodes which can permit application of a time-varying electrical field across the dielectric layer. Dynamic control of the dielectric layer properties, such as the dielectric constant, can be used to retune the dielectric layer physical characteristics to optimize the performance of the resonant line in response to varying signal characteristics, for example a change in operating frequency.

The differential modifying step can further include locally adding additional material to the dielectric layer or supplemental dielectric layer. The addition of material can be used to further control the effective dielectric constant or magnetic properties of the dielectric layer to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanometer size particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic metamaterial particles that are generally suitable for controlling magnetic properties of dielectric layer for a variety of applications described herein include ferrite organoceramics (FexCyHz)-(Ca/Sr/Ba-Ceramic). These particles work well for applications in the frequency range of 8–40 GHz. Alternatively, or in addition thereto, niobium organoceramics (NbCyHz)-(Ca/Sr/Ba-Ceramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer matrix or side chain moiety. In addition to controlling the magnetic properties of the dielectric, the added particles can also be used to control the effective dielectric constant of the material. Using a fill ratio of composite particles from approximately 1 to 70%, it is possible to raise and possibly lower the dielectric constant of substrate dielectric layer and/or supplemental dielectric layer portions significantly. For example, adding organofunctionalized nanoparticles to a dielectric layer can be used to raise the dielectric constant of the modified dielectric layer portions.

Particles can be applied by a variety of techniques including polyblending, mixing and filling with agitation. For example, if the dielectric layer includes a polymer, the dielectric constant may be raised from a nominal value of 2 to as high as 10 by using a variety of particles with a fill ratio of up to about 70%.

Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable dielectric properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low dielectric constant (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. %, to render these or any other material significantly magnetic. For example, magnetic properties may be tailored with organofunctionality. The impact on dielectric constant from adding magnetic materials generally results in an increase in the dielectric constant.

Medium dielectric constant materials have a dielectric constant generally in the range of 70 to 500+/−10%. As noted above these materials may be mixed with other materials or voids to provide desired effective dielectric constant values. These materials can include ferrite doped calcium titanate. Doping metals can include magnesium, strontium and niobium. These materials have a range of 45 to 600 in relative magnetic permeability.

For high dielectric constant applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organofunctional materials, such as polytetrafluoroethylene PTFE.

Alternatively or in addition to organofunctional integration, processing can include solid freeform fabrication (SFF), photo, UV, x-ray, e-beam or ion-beam irradiation. Lithography can also be performed using photo, UV, x-ray, e-beam or ion-beam radiation.

Different materials, including metamaterials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate portion.

A top layer conductor print is then generally applied to the modified substrate layer, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then is further processed as described above or placed into an oven to be fired to a temperature suitable for the processed substrate (approximately 850 C to 900 C for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, dielectric substrate materials can be provided with localized, selected dielectric and/or magnetic characteristics for improving the density and performance of circuits including those having coupled lines serving as bandpass filters. The dielectric flexibility allows independent optimization of the line impedance and electromagnetic coupling of the various elements comprising the coupled line filter.

However, use of conventional board materials can compromise the miniaturization of circuit elements and may also compromise some performance aspects of circuits that can benefit from high dielectric constant layers. A typical tradeoff in a communications circuit is between the physical size of a resonant line versus operational frequency. By comparison, the present invention provides the circuit designer with an added level of flexibility by permitting use of a high dielectric constant dielectric layer portion with magnetic properties optimized for reducing the size of a resonant line and/or transformer line for operation at a specific frequency. Further, the present invention also provides the circuit designer with means for controlling the quality factor (Q) of the resonant line aspects of the two port line. This added flexibility enables improved performance and resonant line density and performance not otherwise possible for radio frequency circuits (RF). As defined herein, radio frequency means any frequency that can be used to propagate an electromagnetic wave.

Referring once again to FIGS. 1 and 2, the coupled line filter is mounted on a substrate or layer of dielectric material (dielectric layer) 11 that includes at least a first region 9 having a first set of substrate properties (such as dielectric properties) including a first dielectric constant, and at least a second region 12 having a second set of substrate properties including a second dielectric constant. The first dielectric constant is preferably different from the second dielectric constant. In this instance, the second region 12 can lie between the resonator line sections 15–21. The substrate can also have other regions such as region 40 having yet another set of substrate properties. As shown, the region 40 occupies an area between the respective resonator elements and the ground plane 50. The present invention contemplates that each of the regions 9, 12 and 40 can have their own dielectric properties, but two out of the three regions could also have substrate properties that are equivalent as contemplated by the present invention.

The dielectric constant of the regions 12 and/or 40 can have a higher permittivity and/or permeability than the first region 9. Accordingly, the size of the resonator elements 15–21 can be smaller than would otherwise be necessary to achieve a selected capacitance between the respective resonator elements and the ground plane 50. Likewise, the size of the transformer line section 112 can be made smaller. Accordingly, this allows for the area of the substrate 11 incorporating the coupled line filter to be smaller than the area that would be required on a conventional circuit board.

The propagation velocity of a signal traveling on a resonant line approximately inversely proportional to $\sqrt{\mu\epsilon}$. Accordingly, increasing the permeability and/or permittivity in the regions 12 or 40 decreases propagation velocity of the signal on the resonant lines, and thus the signal wavelength. Hence, the one-quarter wavelength (or any multiple thereof) of the line can be reduced by increasing the permeability and/or permittivity. Accordingly, the area of the dielectric layer or substrate 11 incorporating the coupled line filter can be smaller than the area required on a conventional circuit board.

The regions 12 and 40 also can have a permittivity selected to achieve a particular capacitance for portions or all of a resonator line. Further, the permeability can be selected to result in a particular inductance for a particular resonator element as well. The permittivity and permeability can be chosen to result in a desired $Z_0$ or other filter characteristics. $Z_0$ can be selected to achieve a desired Q for particular resonances on the resonant line portions, shape the resonant response of the filter, and/or adjust voltage maxima and minima. Further, $Z_0$ can be selected to suppress higher resonant modes and/or to create a mismatch between the impedance of the coupled line filter and the impedance of free space. This impedance mismatch can help to minimize RF radiation from the coupled line filter and reduce electromagnetic interference (EMI).

The resonant characteristics of the two port line coupled line filter 10 can be distributed through the first and second regions of the substrate as the electric fields and magnetic fields formed in these regions store and release energy. The amount of energy stored and released by the fields can be adjusted by controlling permittivities and permeabilities associated with different regions in the dielectric layer. For example, a higher permittivity in a particular region will result in greater energy stored in the electric fields formed in that region. Likewise, higher permeability in a particular region will result in greater energy stored in the magnetic fields formed in that region.

Because the size of the resonant elements or lines can generally be smaller than those on a conventional circuit board, the capacitance can be more easily adjusted to locate voltage minimums and maximums at desired locations along the coupled line filter. Further, regions where the resonant line acts like an inductance or a capacitance can be more easily controlled as well. Hence, the present invention enables greater configurability of resonant lines in comparison to prior art.

Figure 4:
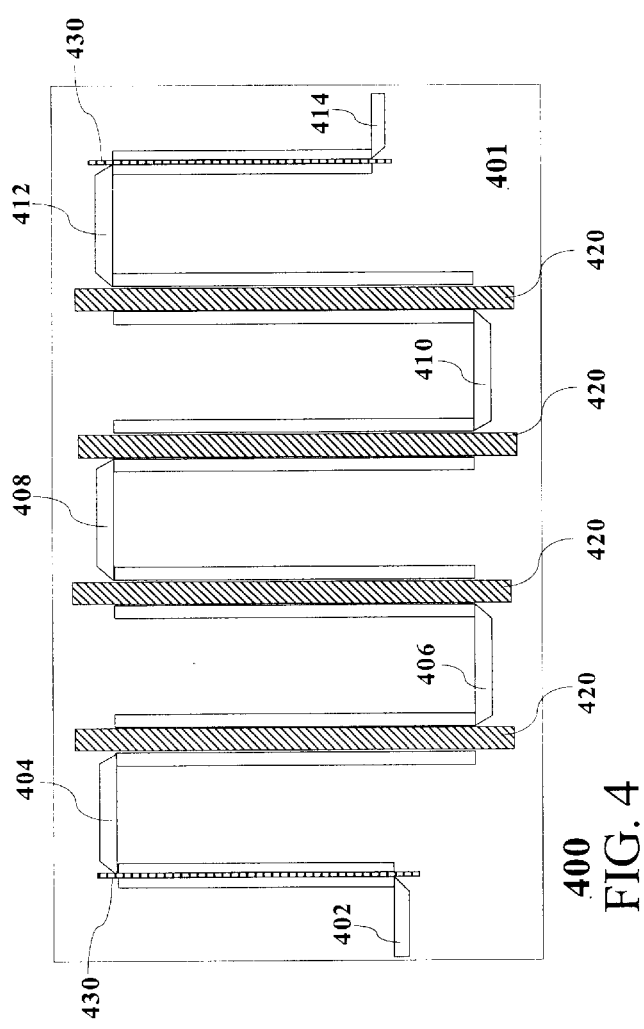
FIG. 4 is a top view of a coupled line filter in the form of a hairpin bandpass filter formed on a substrate in accordance with the present invention.

FIG. 4 illustrates another coupled line filter 400 in the form of a hairpin bandpass filter. Filter 400 is mounted on layer of substrate material or dielectric material (dielectric layer) 401. Filter 400 is configured to have an input port and an output port and a plurality coupled line elements in between. Most of the coupled line elements are substantially U-shaped, such as elements 404, 406, 408, 410 and 412. The elements 402 and 414 at the input and output are substantially L-shaped. The present invention utilizes substrate materials of differing substrate characteristics coupled to the coupled line elements. In particular, substrate materials 420 having different dielectric properties and magnetic properties (than the remainder of substrate 401) are coupled between each substantially U-shaped element and substrate material 430 is coupled between sections 402 and 404 and 412 and 414 as shown in FIG. 4. As previously explained with respect to FIG. 1, magnetic and/or dielectric materials can also be placed underneath the elements (402–414) for filter 400 to shorten and widen the lines of the filter. The width of the lines can be controlled by the addition of magnetic and/or dielectric materials between the lines and ground.

Figure 5:
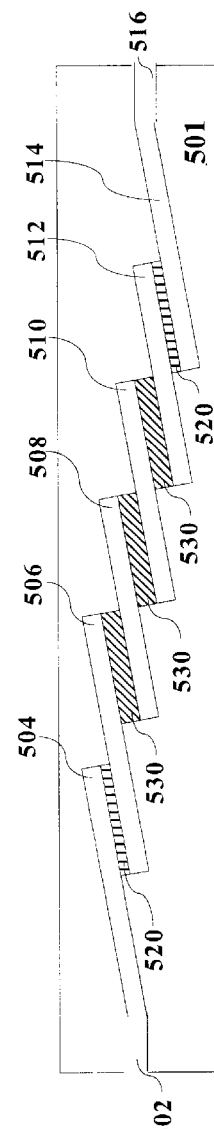
FIG. 5 is a top view of a coupled line filter in the form of an edge coupled bandpass filter formed on a substrate in accordance with the present invention.

FIG. 5 illustrates another coupled line filter 500 in the form of a edge coupled bandpass filter. Filter 500 is mounted on a layer of substrate material or dielectric material (dielectric layer) 501. Filter 500 is configured to have an input port 502 and an output port 516 and a plurality of coupled line elements in between coupled edge to edge such as elements 504, 506, 508, 510, 512, and 514 as shown. The present invention utilizes substrate materials of differing substrate characteristics coupled to the coupled line elements. In particular, substrate materials 520 having different dielectric properties and magnetic properties (than the remainder of substrate 501) are coupled between portion of edges of elements 504 and 506 and elements 512 and 514. Another substrate material 530 is coupled between portion of edges of sections 506, 508, 510 and 512. As previously explained with respect to FIG. 1, magnetic and/or dielectric materials can also be placed underneath the elements (504–514) for filter 500 to shorten and widen the lines of the filter. The width of the lines can be controlled by the addition of magnetic and/or dielectric materials between the lines and ground.

In one embodiment of the invention the permeability of the board substrate dielectric layer can be controlled by the addition of ferromagnetic, diamagnetic or paramagnetic material into the second region(s) to increase the inductance of portions of the coupled line filter. Preferably, the conductivity of the ferromagnetic material is low so as to minimize loss and not short-circuit the resonator sections to any other lines in or on the dielectric layer or to the ground plane.

It should be noted that the coupled line filter configurations are not limited to the exemplary figures shown. For example, the coupled line filters can have resonator elements with varying shapes and can be positioned to have varying distances between the resonator elements line and the ground plane or circuit layer surface. Further, any number of dielectric, ferromagnetic, diamagnetic and/or paramagnetic materials can be incorporated into any regions of the substrate. In one embodiment, $Z_0$ can be controlled over the entire length of coupled line filter, or any part thereof, using multiple dielectric and magnetic mixtures or concentrations to vary $Z_0$ over different regions of the line. For example, $Z_0$ can be controlled to minimize radiation of RF energy or electromagnetic interference (EMI) from the coupled line filter. Further, the dielectric and magnetic properties can be differentially modified at selected portions of the dielectric layer to optimize resonant line performance. In yet another arrangement all dielectric layer portions can be modified by differentially modifying dielectric properties and magnetic properties in all regions of the dielectric layer.

The term "differential modifying" as used herein refers to any modifications, including additions, to the dielectric layer that result in at least one of the dielectric and magnetic properties being different at one portion of the substrate as compared to another portion. For example, the modification can be selective modification where certain dielectric layer portions are modified to produce a first set of dielectric or magnetic properties, while other dielectric layer portions are left un-modified having dielectric and magnetic properties different from the first set of properties resulting from the modification.

Figure 6:
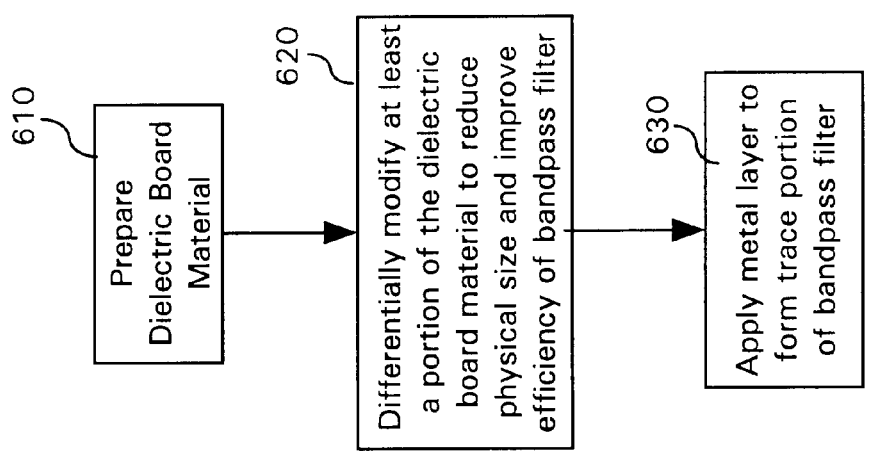
FIG. 6 is a flow chart that is useful for illustrating a process for manufacturing a coupled line filter of reduced physical size in accordance with the present invention.

An embodiment of the method for providing a size and performance optimized resonant line is described with reference to the text below and the flow chart presented in FIG. 6. Referring to FIG. 6, in step 610, board dielectric material is prepared for modification. The board material can include commercially available off the shelf board material, such as RT/duroid® 6002, or customized board material formed from a polymer material, or some combination thereof. The preparation process can be made dependent upon the type of board material selected.

In step 620, one or more dielectric layer portions such as the first region 9 or second region 12 is differentially modified so that the dielectric constant or magnetic properties in the second portion 12 is different as compared to dielectric constant or magnetic properties of the first region 9. In step 630, a metal layer is applied to form the coupled line filter. In step 620, differential modification can be accomplished in several different ways.

According to one embodiment, a supplemental dielectric layer can be added to dielectric layer 11. Techniques known in the art such as various spray technologies, spin-on technologies, various deposition technologies or sputtering can be used to apply the supplemental layer. The supplemental layer can be selectively added in the region 12 or 40, or over the entire existing dielectric layer 11.

The differential modifying step 620 can further include adding additional material to the dielectric layer 11. The addition of material can be used to further control dielectric constant or magnetic properties of the dielectric layer 11 to improve resonant line efficiency or achieve a specific resonant line size.

The additional material that can be added to the dielectric layer can include a plurality of particles. The particles are preferably metallic and/or ceramic particles. Metal particles preferably include iron, tungsten, cobalt, vanadium, manganese, certain rare-earth metals, nickel or niobium particles. The particles are preferably nanosize particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coatings.

Candidate magnetic meta-material particles that are particularly suitable for controlling magnetic properties of dielectric layer 11 for the resonant line applications described herein include Ferrite organoceramics (FexCyHz)-(Ca/Sr/Ba-Ceramic). These particles work well for frequencies in the range of 8–40 GHz. Alternatively, or in addition thereto, Niobium organoceramics (NbCyHz)-(Ca/Sr/Ba-Ceramic) are particularly useful for the frequency range of 12–40 GHz. These and other types of composite particles can be obtained commercially.

In general, coated particles are preferable for use with the present invention as they can aid in binding with a polymer matrix or side chain moiety. In addition to controlling the magnetic properties of the dielectric layer 11, the added particles can also be used to control dielectric constant of the material. Using a fill ratio of composite particles from approximately 1 to 70%, it is possible to raise and possibly lower, the dielectric constant of substrate dielectric layer and/or supplemental dielectric layer portions significantly. For example, adding organofunctionalized nanoparticles to a dielectric layer can be used to raise the dielectric constant of the modified dielectric layer portions.

Particles can be applied by a variety of techniques including polyblending, mixing and filling with agitation. For example, if the dielectric layer includes a polymer, the dielectric constant may be raised from a nominal value of 2 to as high as 10 by using a variety of particles with a fill ratio of up to 70%.

Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A circuit for processing radio frequency signals, comprising:
    a substrate where said circuit can be placed, said substrate including at least one dielectric layer, said dielectric layer having a first set of substrate properties over a first region, and at least a second set of substrate properties over a second region, said second set of substrate properties being different than said first set of substrate properties;
    at least one ground plane coupled to said substrate; and,
    a coupled line filter, at least a portion of said coupled line filter coupled to said second region.

2. The circuit of claim 1, wherein the coupled line filter is a combline bandpass filter, said combline bandpass filter including a plurality of resonator elements coupled to ground and coupled to at least a portion of said second region.

3. The circuit of claim 1, wherein the coupled line filter is a hairpin bandpass filter, said hairpin bandpass filter including a plurality of resonator elements with dielectric layers of the first region and the second region between at least portions of the plurality of resonator elements.

4. The circuit of claim 1, wherein the coupled line filter is an edge coupled bandpass filter, said edge coupled bandpass filter including a plurality of resonator elements with dielectric layers of the first region and the second region between at least portions of the plurality of resonator elements.

5. The circuit of claim 4, wherein the second set of substrate properties of at least the second region are different from the substrate properties of a third region coupled to portions of the plurality of resonator elements.

6. The circuit of claim 2 wherein at least one of said first set of substrate properties includes a first set of magnetic properties and wherein at least one of said first set of dielectric and magnetic properties and said second set of substrate properties is controlled to reduce a size of said combline bandpass filter.

7. The circuit of claim 2 wherein at least one of said first set of substrate properties and said second set of substrate properties is controlled to adjust a position of at least one of a voltage maxima and a voltage minima measured on said combline bandpass filter.

8. The circuit of claim 2 wherein at least one of said first set of substrate properties and said second set of substrate properties is controlled to adjust an amplitude of at least one of a voltage maxima and a voltage minima measured on said combline bandpass filter.

9. The circuit of claim 2 wherein at least one of said first set of substrate properties and said second set of substrate properties is controlled to adjust an impedance on said combline bandpass filter.

10. The circuit of claim 1, wherein at least one of said first set of substrate properties and said second set of substrate properties is controlled to adjust a capacitance and inductance between said coupled line filter and another metallic structure.

11. The circuit of claim 1, wherein at least one of said first set of substrate properties and said second set of substrate properties is controlled to adjust the quality factor (Q) of said coupled line filter.

12. The circuit of claim 1, wherein the first set of substrate properties and the second set of substrate properties are properties selected from the group comprising permeability and permittivity.

13. A printed circuit for processing radio frequency signals, comprising:
    a substrate upon which said circuit can be placed, said substrate including at least one dielectric layer, said dielectric layer having a first set of dielectric and magnetic properties over a first region, and at least a second set of dielectric and magnetic properties over a second region, said second set of dielectric and magnetic properties providing a different dielectric permittivity and magnetic permeability as compared to said first set of dielectric and magnetic properties;
    at least one ground disposed in or on said substrate; and, a coupled line filter, said coupled line filter including a plurality of resonator elements coupled to at least a portion of said second region.

14. The circuit of claim 13 wherein at least one of said first set of dielectric and magnetic properties and said second set of dielectric and magnetic properties is controlled to reduce a size of said coupled line filter.

15. The circuit of claim 13 wherein the substrate further includes a dielectric layer having a third set of dielectric and magnetic properties over a third region.

16. The circuit of claim 15 wherein the plurality of resonator elements are coupled to the third region and the second region lies between each of the resonator elements in the plurality of resonator elements.

17. The circuit of claim 13 wherein at least one of said first set of dielectric and magnetic properties and said second set of dielectric properties is controlled to adjust a capacitance and inductance between said coupled line filter and another metallic structure.

18. The circuit of claim 13 wherein at least one of said first set of dielectric and magnetic properties and said second set of dielectric and magnetic properties is controlled to adjust the quality factor (Q) of said coupled line filter.

19. A printed circuit for processing radio frequency signals, comprising:
- a substrate including substrate regions upon which said circuit can be placed, wherein said circuit is a coupled line filter, said coupled line filter including a plurality of resonator line elements; and
- at least one ground coupled to said substrate, wherein the plurality of resonator line elements are at least partially coupled to respective substrate regions that have substrate characteristics that are each independently customizable.

20. The printed circuit of claim 19, wherein the substrate characteristics that are each independently customizable are selected from the group comprising dielectric permittivity and magnetic permeability.

* * * * *